United States Patent
Watanabe

(10) Patent No.: US 7,009,649 B2
(45) Date of Patent: Mar. 7, 2006

(54) SOLID-STATE IMAGE SENSOR DEVICE AND SOLID-STATE IMAGE SENSOR APPARATUS INCLUDING SAME

(75) Inventor: Takashi Watanabe, Soraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 782 days.

(21) Appl. No.: 09/874,754

(22) Filed: Jun. 5, 2001

(65) Prior Publication Data

US 2002/0018132 A1 Feb. 14, 2002

(30) Foreign Application Priority Data

Jun. 6, 2000 (JP) .............................. 2000-169649

(51) Int. Cl.
   *H04N 5/335* (2006.01)
   *H01L 27/00* (2006.01)
   *H01L 31/113* (2006.01)

(52) U.S. Cl. .................... 348/308; 250/208.1; 257/291

(58) Field of Classification Search ........ 348/294–324; 250/208.1; 257/291, 292, 443–448
See application file for complete search history.

(56) References Cited

U.S. PATENT DOCUMENTS

| | | | | |
|---|---|---|---|---|
| 5,436,949 A | * | 7/1995 | Hasegawa et al. .......... | 257/239 |
| 5,608,204 A | | 3/1997 | Höfflinger et al. | |
| 5,721,425 A | | 2/1998 | Merrill | |
| 5,818,052 A | * | 10/1998 | Elabd .......................... | 257/444 |
| 5,880,460 A | * | 3/1999 | Merrill ........................ | 348/308 |
| 5,933,190 A | * | 8/1999 | Dierickx et al. ............. | 348/302 |
| 5,936,866 A | | 8/1999 | Seitz et al. | |
| 5,952,686 A | | 9/1999 | Chou et al. | |
| 6,246,043 B1 | * | 6/2001 | Merrill ..................... | 250/208.1 |
| 6,323,479 B1 | * | 11/2001 | Hynecek et al. ............ | 348/308 |
| 6,355,965 B1 | * | 3/2002 | He et al. ..................... | 348/302 |
| 6,380,572 B1 | * | 4/2002 | Pain et al. ................... | 348/308 |
| 6,384,394 B1 | * | 5/2002 | Afghahi ...................... | 348/308 |
| 6,441,852 B1 | * | 8/2002 | Levine et al. ............... | 348/302 |
| 6,600,513 B1 | * | 7/2003 | Ozumi ........................ | 348/311 |
| 6,636,261 B1 | * | 10/2003 | Pritchard et al. ......... | 250/208.1 |
| 6,667,767 B1 | * | 12/2003 | Muramatsu et al. ........ | 348/302 |
| 6,677,993 B1 | * | 1/2004 | Suzuki et al. ............... | 348/302 |
| 6,784,934 B1 | * | 8/2004 | Watanabe .................... | 257/291 |

FOREIGN PATENT DOCUMENTS

| | | |
|---|---|---|
| DE | 195 33 061 A1 | 3/1997 |
| DE | 197 07 928 A1 | 9/1997 |

(Continued)

*Primary Examiner*—David L. Ometz
*Assistant Examiner*—Nhan T. Tran
(74) *Attorney, Agent, or Firm*—Edwards Angell Palmer & Dodge LLP; David G. Conlin; George W. Hartnell

(57) ABSTRACT

A solid-state image sensor device comprises a photoelectric converter for converting incident light to electric charge, a logarithmic converter for logarithmically converting a photoelectric current output from the photoelectric converter, the logarithmic converter consisting of a first MOS transistor including a source connected to the photoelectric converter and a drain connected to a power source, and a read-out section for reading out a signal obtained by the first MOS transistor converting the photoelectric current output from the photoelectric converter, the read-out section including a second MOS transistor including a gate connected to the photodiode and a source of the first MOS transistor and a drain connected to a drain of the first MOS transistor. A gate potential of the first MOS transistor is fixed between a power source potential and a ground potential.

7 Claims, 10 Drawing Sheets

FOREIGN PATENT DOCUMENTS

| | | | |
|---|---|---|---|
| DE | 198 32 791 A1 | | 6/1999 |
| JP | 03-203382 | * | 9/1991 |
| JP | 7-506932 | | 7/1995 |
| JP | 9298286 | | 11/1997 |
| JP | 11-264761 | * | 9/1999 |
| WO | WO 93/19489 | | 9/1993 |

* cited by examiner

900

SOLID-STATE IMAGE SENSOR DEVICE AND SOLID-STATE IMAGE SENSOR APPARATUS INCLUDING SAME

BACKGROUND OF THE INVENTION

1. Field of the Invention

The present invention relates to a solid-state image sensor device, and a solid-state image sensor apparatus including the same.

2. Description of the Related Art

An amplifying solid-state image sensor apparatus has been proposed, which includes a solid-state image sensor device having a function of signal amplification in which an amplified photoelectric current is read out by a scanning circuit. Particularly, a CMOS (Complementary Metal Oxide Semiconductor) solid-state image sensor apparatus is known, which includes a solid-state image sensor device and a peripheral driving circuit or a signal processing circuit which include CMOS.

The solid-state image sensor device included in the CMOS solid-state image sensor apparatus needs to include a photoelectric converter, an amplifier, a pixel selector, and the like. Therefore, the CMOS solid-state image sensor apparatus includes several MOS transistors (T) in addition to the photoelectric converter including a photodiode (PD).

FIG. 9 shows a structure of a PD+3T type CMOS solid-state image sensor device 900 (Mabuchi et al., "¼-inch VGA Mode 33K-pixel CMOS Image Sensor", Technical Reports of the Institute of Image Information and Television Engineers, IPU97-13, March 1997). The solid-state image sensor device 900 includes a photodiode 1, a resetting portion 8 (MOS transistor), an amplifier 3 (MOS transistor), a device selector 4 (MOS transistor), and a signal line 5. A reset clock is indicated by $\phi_{RST}$. A device selection clock is indicated by $\phi_{SEL}$. A power source potential is indicated by $V_D$.

An operation of the solid-state image sensor device 900 will be described. After the resetting portion 8 performs a resetting operation to reset the photodiode 1 to source power potential $V_D$, a signal charge is generated by incident light hv. Due to the generation of the charge, the source potential of the resetting portion 8 is decreased from $V_S$ to $V_D$. The amount of the decrease is proportional to the strength of the incident light and the accumulation time. Therefore, if the accumulation time is constant, the amount of change in the source potential $V_S$ is proportional to the strength of the incident light. The change in the source potential $V_S$ is amplified by the amplifier 3, and thereafter the change in the source potential $V_S$ is selected by the device selection portion 4 and output to the signal line 5.

However, in the solid-state image sensor device 900, the signal is proportional to the strength of the incident light. Therefore, if the incident light is considerably strong, a problem occurs where the dynamic range is narrowed.

To obtain a large dynamic range for the incident light, a method has been proposed in which a photoelectric current is logarithmically compressed and then read out (Japanese National Phase PCT Laid-open Publication No. 7-506932, Japanese Laid-open Publication No. 9-298286, and the like).

FIG. 10 shows a structure of another conventional solid-state image sensor device 1000. Hereinafter, an n-channel pixel is used as the solid-state image sensor device 1000. Note that a case where a p-channel pixel is used as the solid-state image sensor device 1000 can be similarly described. The solid-state image sensor device 1000 includes a photodiode 1, an amplifier 3 (MOS transistor), a device selector 4 (MOS transistor), and a signal line 5. Device selection clock is indicated by $\phi_{SEL}$. Power source potential is indicated by $V_D$. A major difference to the solid-state image sensor device 900 is that a MOS transistor 2 is provided which logarithmically converts a photoelectric current $I_p$ of the photodiode 1. The solid-state image sensor device 1000 automatically shifts the photoelectric current $I_p$ so that a source potential $V_S$ consistently corresponds to the photoelectric current. In this case, an accumulation operation is not performed, so that a resetting operation is not required.

Hereinafter, an operation of the MOS transistor 2 will be described in detail. FIG. 11 is a diagram used for explaining the potential of the MOS transistor 2 of the conventional solid-state image sensor device 1000. As shown in FIG. 10, the gate potential $V_G$ of the MOS transistor 2 is fixed to the power source potential $V_D$. Therefore, the potential of a channel portion of the MOS transistor 2 is a constant value $\phi_G(H)$. When the source potential $V_S$ is deeper than $\phi_G(H)$, the MOS transistor 2 performs a weak inversion operation (an operation in a sub-threshold region). In this case, a current $I_D$ is a diffusion current $I_{dif}$ flowing from the source end to the drain end of the channel portion under the gate. The amount of charge on the source end and the amount of charge on the drain end are dependent on the difference in potential between the gate and the source ($V_S-\phi_G$) and the difference in potential between the gate and the drain ($V_D-\phi_G$). The current $I_D$ is represented by:

$$I_D = I_0 \cdot \exp[-q(\alpha V_G - V_S)/kT] \cdot (1 - \exp[-q(V_D - V_S)/kT]) \quad (1)$$

$$\phi_G = \phi_0 + \alpha V_G$$

where $I_0$ is a constant, q is an electron charge, k is Boltzmann's constant, and T is an absolute temperature (e.g., C. Mead, "Analog VLSI and Neural Systems", Addison-Wesley, 1989). Further, $\alpha$ is somewhat less than 1, although $\alpha$ is dependent on the thickness of the gate insulating film and the impurity concentration of the channel. Note that the potential of the substrate is assumed to be at a reference potential (GND).

In formula (1), since $q(V_D-V_S)/kT \gg 1$, $(1-\exp[-q(\alpha V_D-V_S)/kT])$ can be approximated by one. Therefore, formula (1) can be approximated by:

$$\log(I_D) = [-q(\alpha V_G - V_S)/kT] + \text{const.} \quad (2)$$

Since the gate potential $V_G$ of the MOS transistor 2 of the solid-state image sensor device 1000 is the constant value $V_D$, the source potential $V_S$ is proportional to $\log(I_D)$ in accordance with formula (2).

Further, the source potential $V_S$ of the MOS transistor 2 changes so that the current $I_D$ is equal to the photoelectric current $I_P$, as described below. If $I_P > I_D$, the source potential $V_S$ is decreased, so that $V_G - V_S$ of the MOS transistor 2 increases and $I_D$ is increased. If $I_P < I_D$ the source potential $V_S$ increases, so that $V_G - V_S$ of the MOS transistor 2 decreases and $I_D$ is decreased. As a result, $I_P = I_D$, and the source potential $V_S$ is proportional to $\log(I_P)$. In other words, the source potential $V_S$ is a value obtained by logarithmically converting a photoelectric current.

FIG. 12 is a diagram used for explaining the logarithmic-conversion characteristics of a solid-state image sensor device. The horizontal axis indicates $\alpha V_G - V_S$, and the vertical axis indicates $\log(I_D)$. When the MOS transistor 2 performs a weak inversion operation, $\alpha V_G - V_S$ is proportional to $\log(I_D)$ where $\alpha V_G - V_S < \alpha V_{th}$ (threshold potential) (formulas (1) and ($_2$)).

The upper limit of a photoelectric current that can be logarithmically converted ($I_{max}$) is obtained when $\alpha V_G - V_S = \alpha V_{th}$. The lower limit of a photoelectric current that can be logarithmically converted ($I_{min}$) is constrained by the dark current of the photodiode (e.g., Y. P. Tsividis, "Operation and Modeling of the MOS Transistor", McGraw-Hill, 1988). In this case, since the upper limit $I_{max}$ is substantially a constant value, the range (dynamic range) of a photoelectric current which can be logarithmically converted is constrained by the dark current of a photodiode.

However, there is the following problem with the solid-state image sensor device 1000. The dark current of a photodiode is significantly dependent on the strength of a field at a junction interface. As the field strength is increased, the dark current is rapidly increased. The field strength at the junction interface is dependent on the gradient of the concentration of the junction interface and the bias voltage applied to the junction interface. Further, in the solid-state image sensor device 1000, a bias voltage $V_J$ of the photodiode is $V_S$.

FIG. 13 shows a relationship between the bias voltage $V_J$ and the dark current $I_{dark}$ of the photodiode. In the solid-state image sensor device 1000, since the bias voltage $V_J$ is $V_S(H)$ which is deeper than the potential $\phi_G(H)$ of the channel portion under the gate (FIG. 11), the dark current $I_{dark}(H)$ is a high value (FIG. 13).

When an n-channel pixel is used as the above-described solid-state image sensor device, a structure of the pixel is provided using a typical CMOS production method in such a manner that high-concentration N⁺ layers 12 and 13 are formed in a well 11 having a relatively high concentration in a p-type low-concentration substrate 10 (FIG. 14). The structure of the pixel of FIG. 14 includes an N-type region 12 of a photodiode, a source or drain region 13 of a MOS transistor, and an oxide film 14 for isolating devices.

When a typical production method is used, the concentration gradient of the junction interface of a photodiode is high. Therefore, the field strength of the junction interface of a photodiode is increased, such that the dark current is further increased.

Hereinafter, functions of the present invention will be described.

According to the present invention, the gate potential of the first MOS transistor for logarithmically converting a photoelectric current output from the photodiode is fixed to a potential between the power source potential and the ground potential. The bias voltage of the photodiode is set to a value lower than that of conventional structures. Since a dark current is dependent on the bias voltage of the photodiode, the dark current can be reduced, and the lower limit of a photoelectric current which can be logarithmically converted is further lowered.

Further, according to the present invention, when the gate potential is sufficiently lower than the power source potential so as to be slightly higher than the threshold potential when the source is ground, the bias voltage of a photodiode is slightly higher than a ground potential GND which is a reference potential. Therefore, a dark current is reduced to a great extent, and the lower limit of a photoelectric current that can be logarithmically converted is further lowered.

It is likely that the voltage level of an output signal which is logarithmically converted is decreased, such that a second MOS transistor falls outside the operation range. In this case, when the second MOS transistor is of a depression type, the input range of the second MOS transistor can be shifted toward a low voltage side, thereby maintaining the operation range.

Further, according to the present invention, at least a portion of the diffusion region constituting the photodiode is provided in a low-impurity-concentration region, so that the concentration gradient of the junction interface can be reduced. Therefore, the field strength of the photodiode is more effectively lowered, thereby making it possible to further reduce dark current.

SUMMARY OF THE INVENTION

According to one aspect of the present invention, a solid-state image sensor device comprises a photoelectric converter for converting incident light to electric charge, a logarithmic converter for logarithmically converting a photoelectric current output from the photoelectric converter, the logarithmic converter consisting of a first MOS transistor including a source connected to the photoelectric converter and a drain connected to a power source, and a read-out section for reading out a signal obtained by the first MOS transistor converting the photoelectric current output from the photoelectric converter, the read-out section including a second MOS transistor including a gate connected to the photodiode and a source of the first MOS transistor and a drain connected to a drain of the first MOS transistor. A gate potential of the first MOS transistor is fixed between a power source potential and a ground potential.

In one embodiment of this invention, the gate potential of the first MOS transistor is higher than a threshold potential when the source of the first MOS transistor is grounded, and is sufficiently lower than the power source potential.

In one embodiment of this invention, the second MOS transistor is of a depression type.

In one embodiment of this invention, at least a portion of a diffusion region included in the photoelectric converter is provided in a low-impurity-concentration region.

According to another aspect of the present invention, a solid-state image sensor apparatus comprises at least one solid-state image sensor device. The solid-state image sensor device includes a photoelectric converter for converting incident light to electric charge, a logarithmic converter for logarithmically converting a photoelectric current output from the photoelectric converter, the logarithmic converter consisting of a first MOS transistor including a source connected to the photoelectric converter and a drain connected to a power source, and a read-out section for reading out a signal obtained by the first MOS transistor converting the photoelectric current output from the photoelectric converter, the read-out section including a second MOS transistor including a gate connected to the photodiode and a source of the first MOS transistor and a drain connected to a drain of the first MOS transistor. A gate potential of the first MOS transistor is fixed between a power source potential and a ground potential. The read-out section has a switching element for selecting whether to connect to a signal line. A source of the second MOS transistor is connected via the switching element to the signal line.

Thus, the invention described herein makes possible the advantages of providing a solid-state image sensor device in which the sensitivity is improved and the dynamic range is increased by further lowering the lower limit of a photoelectric current that can be logarithmically converted by reducing the dark current of a photodiode.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. Note that although an n-channel pixel is herein used as a solid-state image sensor device, a p-channel pixel may be used as a solid-state image sensor device where the polarity is inversed.

EXAMPLE 1

Figure 1:
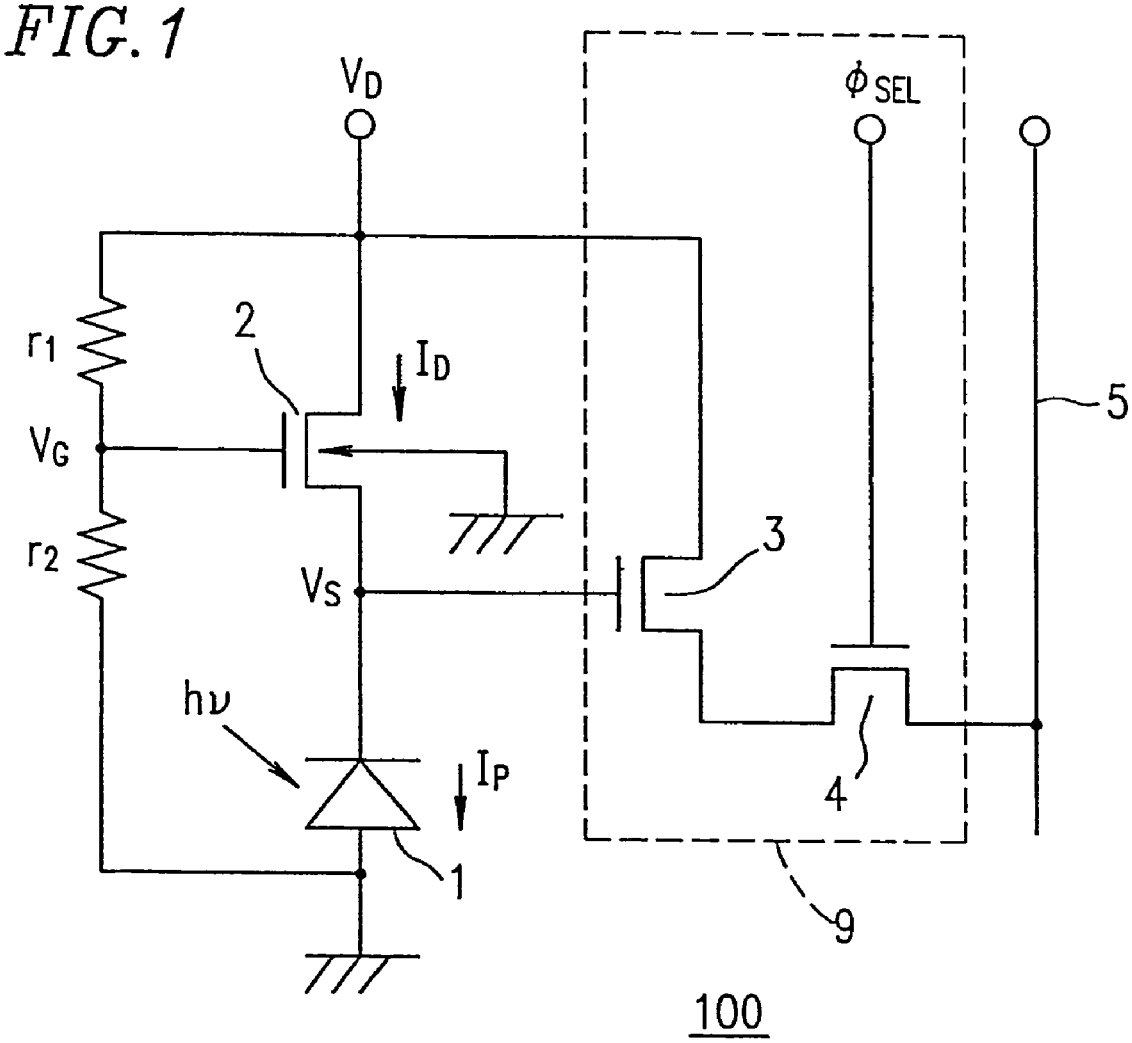
FIG. 1 is a circuit block diagram showing a structure of a solid-state image sensor device 100 according to Example 1 of the present invention.

FIG. 1 is a circuit block diagram showing a structure of a solid-state image sensor device 100 according to Example 1 of the present invention. The solid-state image sensor device 100 includes a photodiode 1, a first MOS transistor 2 for logarithmically converting a photoelectric current $I_P$ of the photodiode 1, a second MOS transistor 3 for amplification, a third MOS transistor 4 for selecting devices, and a signal line 5. A device selection clock is indicated by $\phi_{SEL}$. A power source potential is indicated by $V_D$. A read-out section 9 is composed of the second MOS transistor 3, the third MOS transistor 4, and the pixel selection clock $\phi_{SEL}$.

The photodiode 1 functions as a photoelectric converter for converting incident light to charge. The first MOS transistor 2 has a source connected to the photoelectric converter and a drain connected to a power source. The first MOS transistor 2 functions as a logarithmic converter for logarithmically converting a photoelectric current output from the photoelectric converter. The second MOS transistor 3 has a gate connected to the photoelectric converter and the source of the first MOS transistor 2, and a drain connected to the drain of the first MOS transistor 2. The second MOS transistor 3 functions as a read-out section for reading out a signal obtained by converting a photoelectric current output from the photoelectric converter by the first MOS transistor 2. The third MOS transistor 4 functions as a switch element for selecting whether to connect to the signal line 5. The source of the second MOS transistor 3 is connected via the third MOS transistor 4 to the signal line 5. Further, as described above, the gate potential $V_G$ of the first MOS transistor 2 is fixed to a potential between a power source potential $V_D$ and a ground potential GND. In the solid-state image sensor device 100 of Example 1, the gate potential $V_G$ of the first MOS transistor 2 is not equal to the power source potential $V_D$, and is obtained by dividing $V_D$ by resistances $r_1$ and $r_2$, i.e., represented by:

$$V_G = V_D \cdot r_2/(r_1+r_2) \qquad (3).$$

The value of $V_G$ is preferably set to a value equal to or somewhat higher than (e.g., as much as about 0.5 V higher) a threshold potential ($V_{TH}$) of the grounded source of the first MOS transistor 2.

Figure 2:
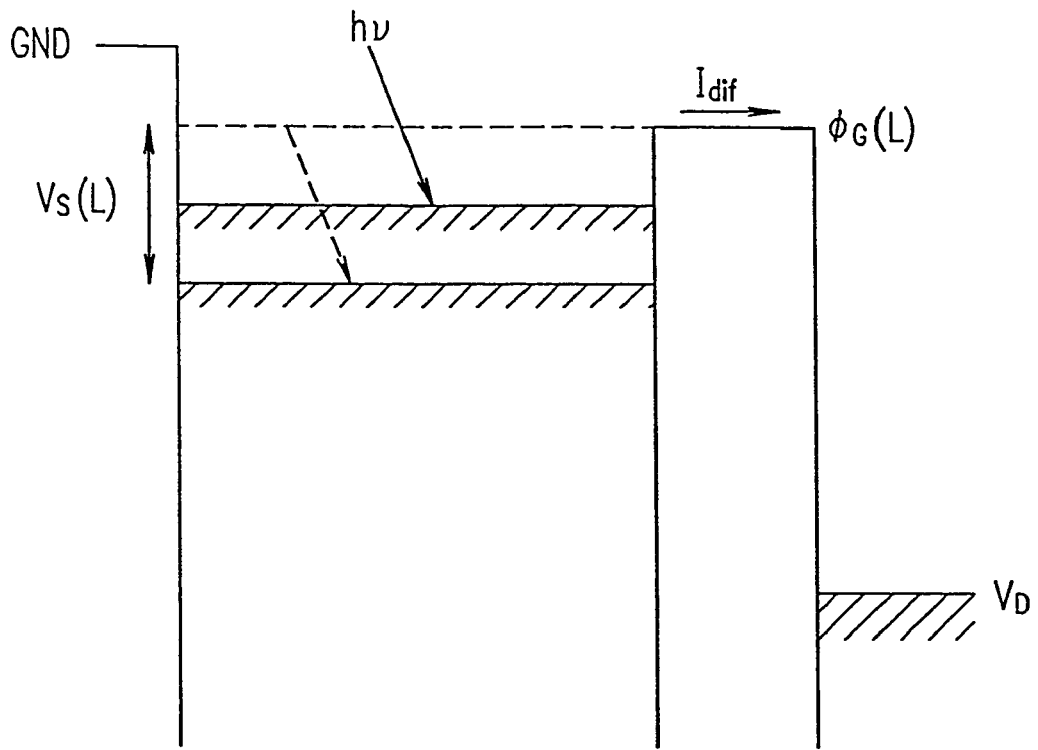
FIG. 2 is a diagram used for explaining a relationship between potentials in a first MOS transistor of the solid-state image sensor device 100 of Example 1.

The reason will be described. FIG. 2 is a diagram used for explaining a relationship between potentials in the first MOS transistor 2. As shown in FIG. 1, since the gate potential $V_G$ of the first MOS transistor 2 is fixed to a value which is sufficiently lower than the power source potential $V_D$, the potential of the channel portion of the first MOS transistor 2 is a constant value $\phi_G(L)$. When the source potential $V_S$ of the first MOS transistor 2 is deeper than $\phi_G(L)$, the first MOS transistor 2 performs a weak inversion operation (i.e., an operation in a sub-threshold region). In this case, a current $I_D$ is a diffusion current $I_{dif}$ flowing from the source end to the drain end of the channel portion under the gate. The current $I_D$ is represented by formula (1). A relationship between $V_S$ and $\log(I_D)$ is proportional as shown in formula (2).

Figure 3:
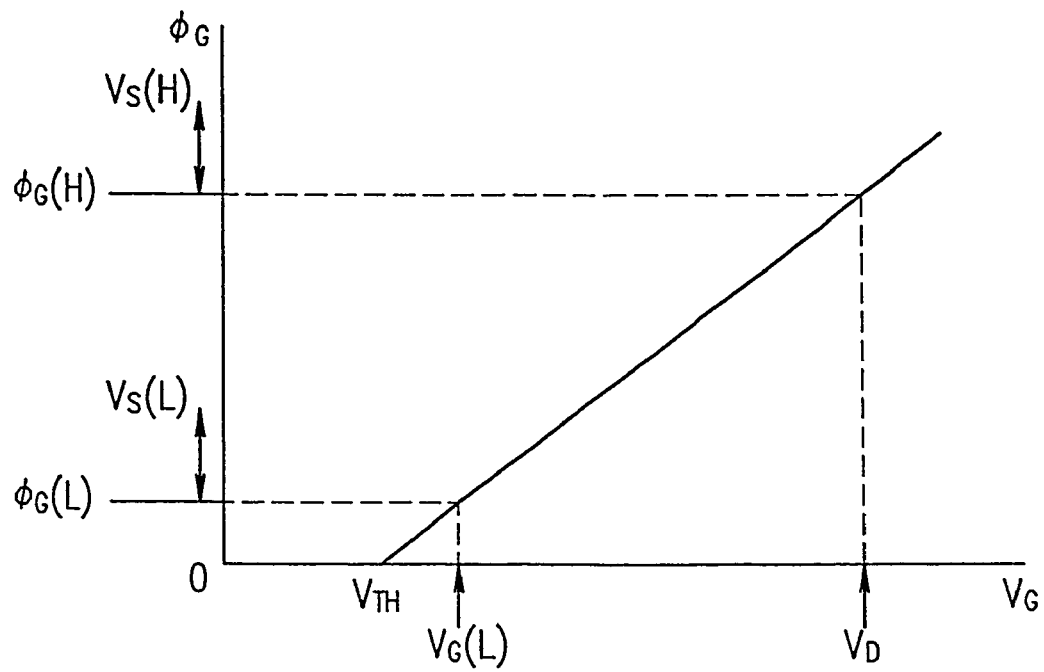
FIG. 3 is a diagram showing a relationship between the gate potential $V_G$ and the channel potential $\phi_G$ of the solid-state image sensor device 100 of Example 1.
Figure 11:
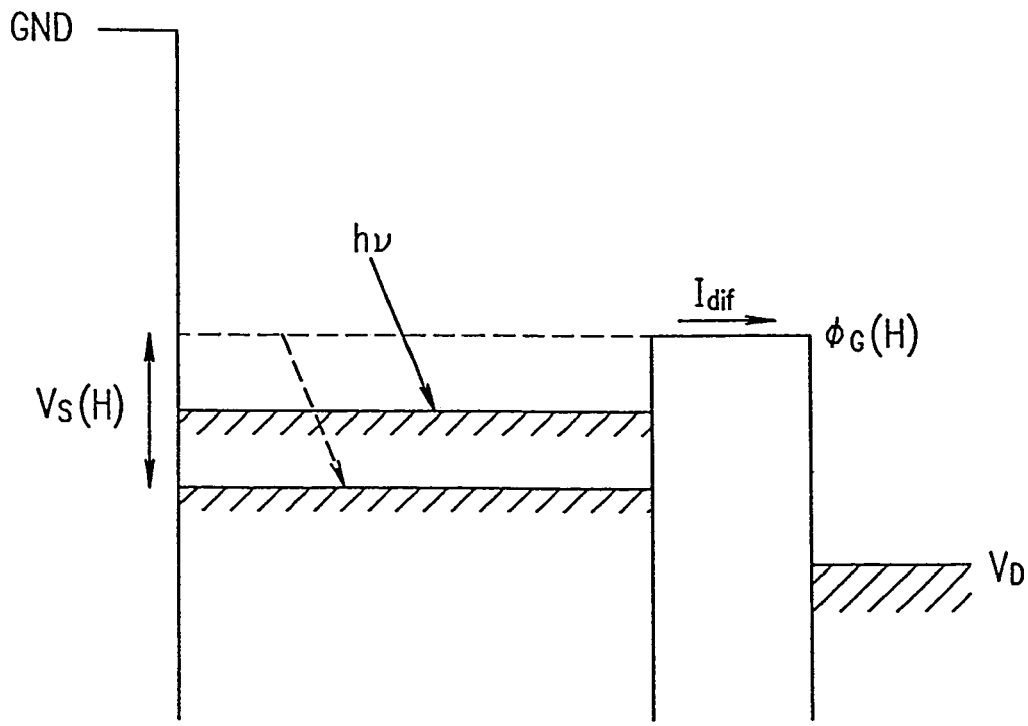
FIG. 11 is a diagram used for explaining a relationship between potentials in a MOS transistor of the conventional solid-state image sensor device 1000.

In FIG. 2, the difference between the source potential $V_S$ and the ground potential GND (substrate potential) which is a reference potential for the source potential $V_S$, is considerably low compared with the conventional device (FIG. 11). FIG. 3 is a diagram showing a relationship between the gate potential $V_G$ and the channel potential $\phi_G$ of the solid-state image sensor device 100 of Example 1. The horizontal axis represents the gate potential $V_G$, and the vertical axis represents the channel potential $\phi_G$. The gate potential $V_G$ where $\phi_G=0$ is the threshold ($V_{TH}$) when the source is grounded.

In the conventional device, since $V_G=V_D=V_G(H)$, then $V_S(H)>\phi_G(H)$, such that the bias potential $V_J$ (=$V_S$) applied to the junction portion of the photodiode 1 is a high value (FIG. 11). In contrast, in Example 1, since $V_G=V_{TH}+\Delta=V_G(L)$ ($\Delta$ is a small voltage value), then $V_S(L)>\phi_G(L)$, such that the bias potential $V_J$ (=$V_S$) applied to the junction portion of the photodiode 1 is a low value (FIG. 2).

The dark current of the photodiode 1 is significantly dependent on the bias potential $V_J$ (=the source voltage $V_S$).

In Example 1, the source voltage $V_S$ can be reduced to a great extent from $V_S(H)$ to $V_S(L)$. Therefore, the dark current $I_{dark}$ is decreased to a great extent from $I_{dark}(H)$ to $I_{dark}(L)$.

Figure 12:
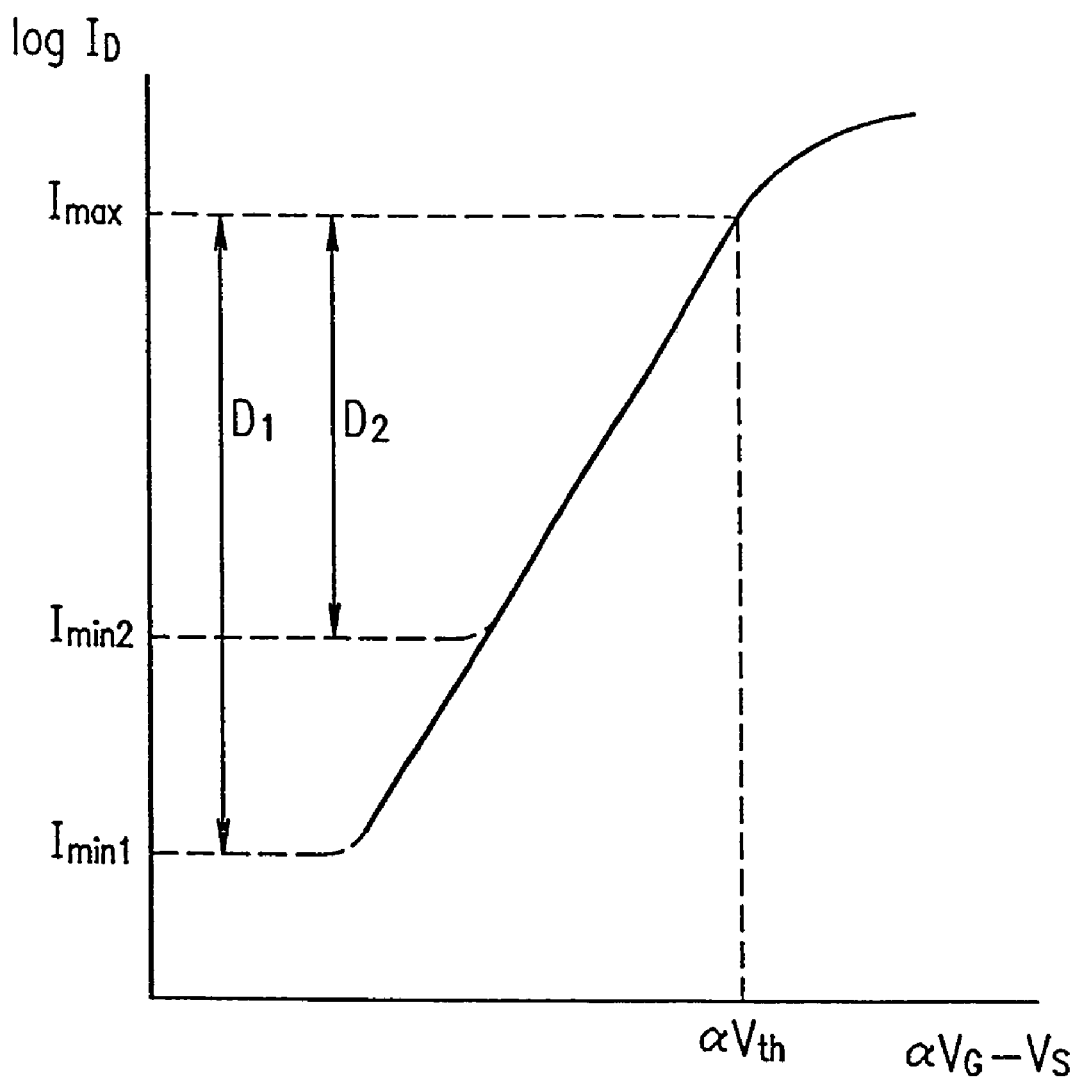
FIG. 12 is a diagram used for explaining the logarithmic-conversion characteristics of a solid-state image sensor device.
Figure 13:
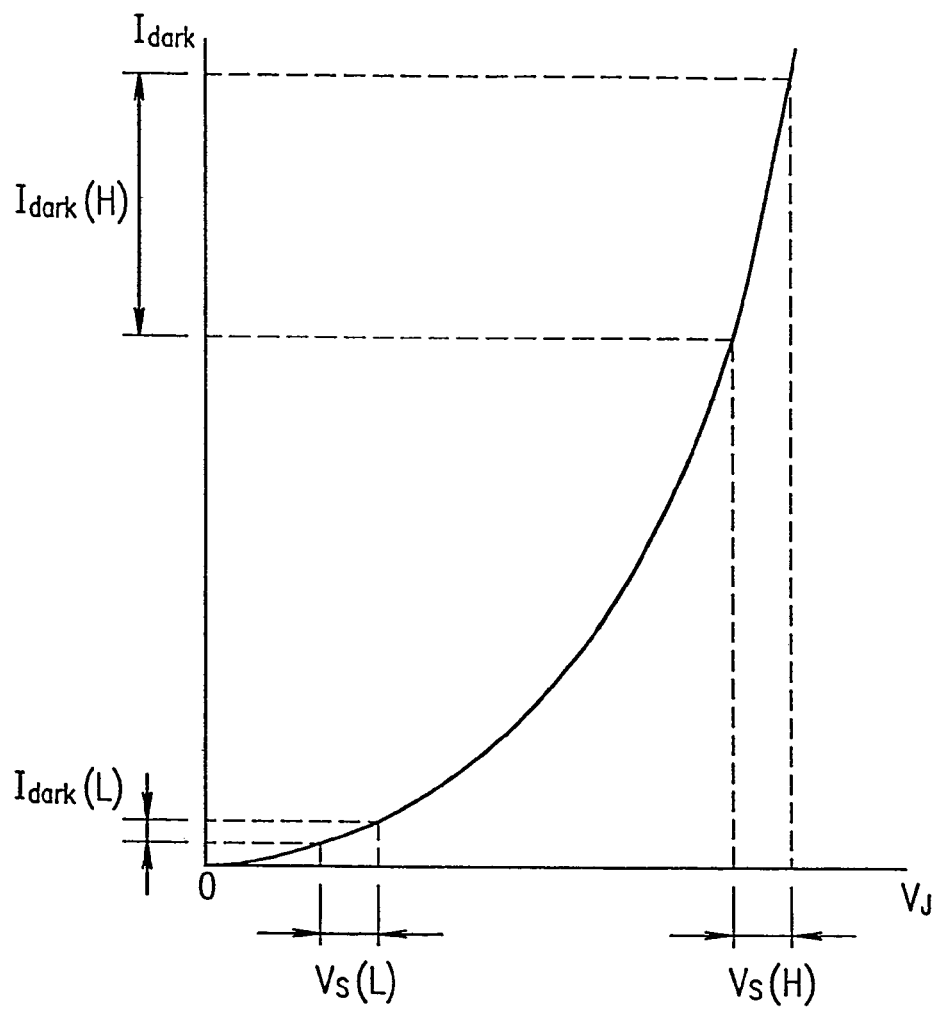
FIG. 13 is a diagram showing a relationship between a dark current characteristic of a photodiode and a bias voltage.

As the dark current of the photodiode 1 is decreased, the upper limit of a photoelectric current which can be logarithmically converted is further lowered from $I_{min1}$ to $I_{min2}$ (FIG. 12), thereby improving the sensitivity. Further, the dynamic range which is a range of a photoelectric current which can be logarithmically converted is enlarged from $D_2$ to $D_1$.

Note that in Example 1, although the third MOS transistor 4 is provided as the switch element, a CMOS switch in which P- and N-channel MOS transistors which are complementary to each other are provided, may be used. The same applies to the following examples.

EXAMPLE 2

Figure 4:
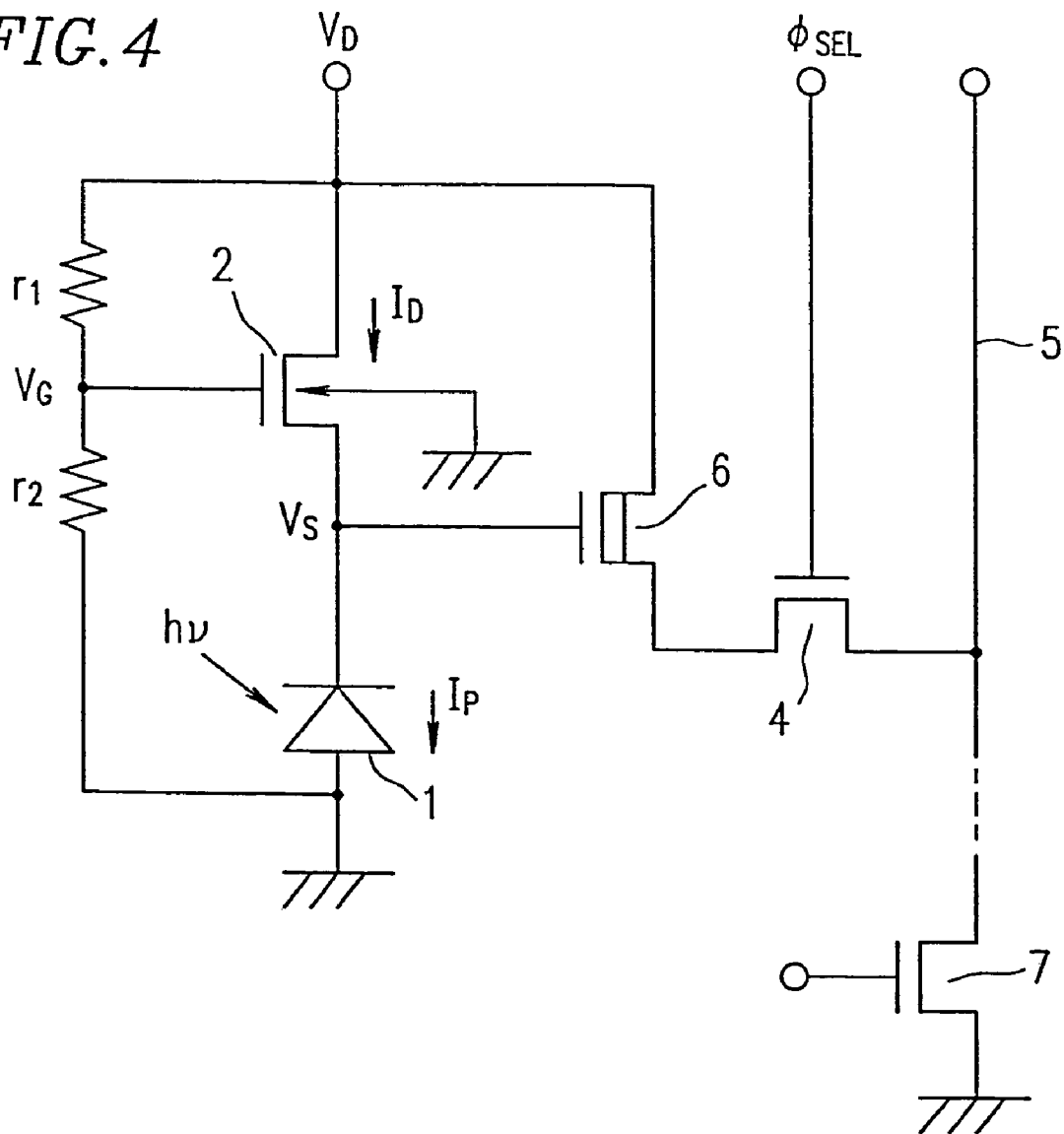
FIG. 4 is a circuit block diagram showing a structure of a solid-state image sensor device 400 according to Example 2 of the present invention.

FIG. 4 is a circuit block diagram showing a structure of a solid-state image sensor device 400 according to Example 2 of the present invention.

A difference to the solid-state image sensor device 100 is that a second MOS transistor is changed from a typical enhancement transistor 3 to a depression transistor 6. For the sake of simplicity in describing the operation, a MOS transistor 7 for a load (hereinafter also referred to as a load MOS transistor) is connected between a signal line 5 and the ground. The load MOS transistor 7 may be similarly provided in the structure of Example 1.

When a third MOS transistor 4 for selecting devices is in an ON state, a source follower circuit is constructed between a second MOS transistor 6 for amplification and the load MOS transistor 7.

Figure 5:
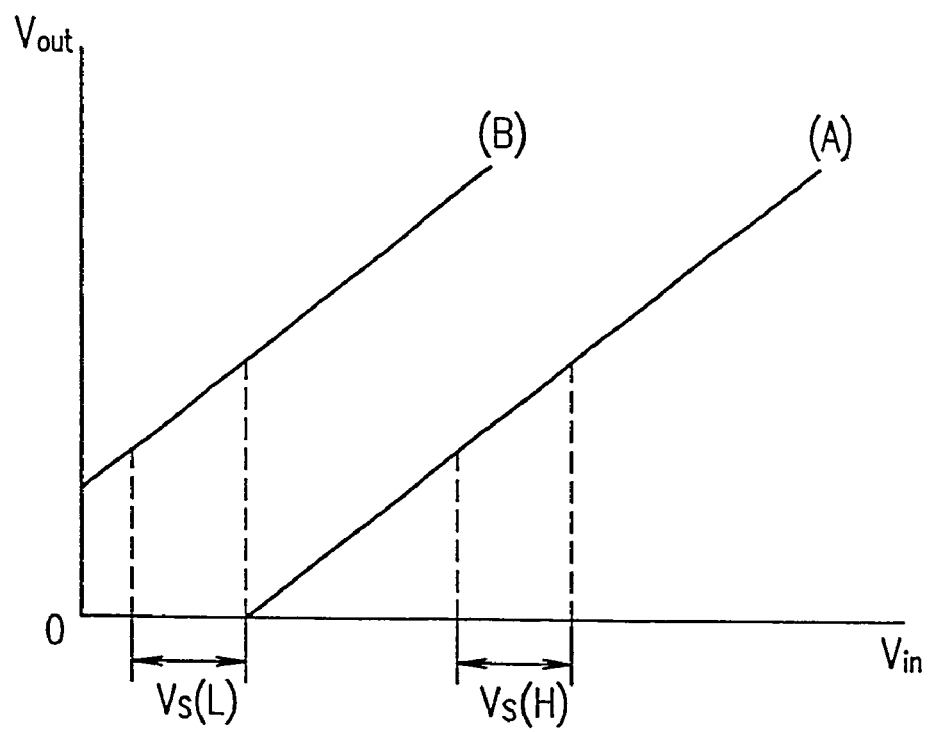
FIG. 5 is a diagram showing the input-output characteristics of a second MOS transistor 6 of the solid-state image sensor device 400 of Example 2.

FIG. 5 is a diagram showing the input-output characteristics of the second MOS transistor 6 of the solid-state image sensor devices 100 and 400 of Example 2. In FIG. 5, (A) indicates the input-output characteristics of the second MOS transistor 3 of Example 1 which is of an enhancement type, and (B) indicates the input-output characteristics of the second MOS transistor 6 of Example 2 which is of a depression type.

As described in Example 1, when the source voltage $V_S$ is reduced to a great extent from $V_S(H)$ to $V_S(L)$, the second MOS transistor of the conventional enhancement type (A) does not perform a normal operation. Therefore, the second MOS transistor is changed to the depression type (B), so that the second MOS transistor can perform a normal operation even when the source voltage $V_S$ is reduced to $V_S(L)$.

EXAMPLE 3

Figure 6:
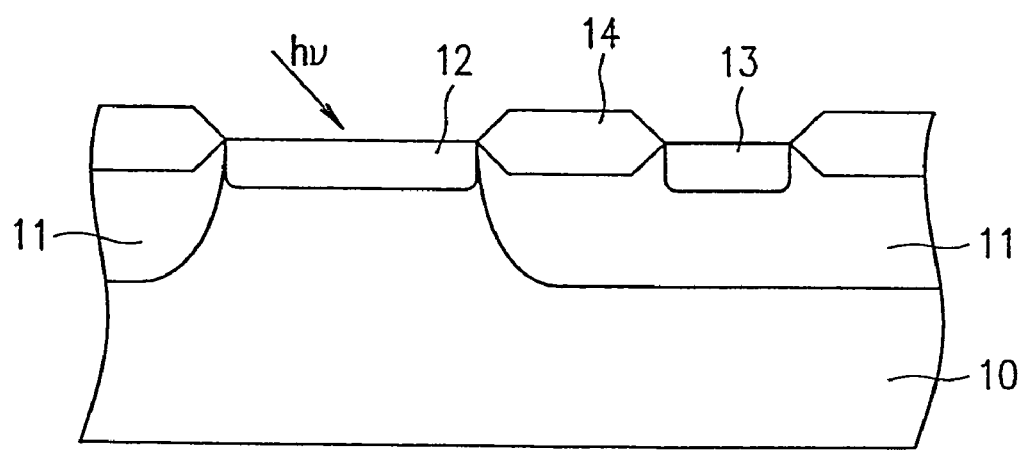
FIG. 6 is a cross-sectional diagram showing a structure of a solid-state image sensor device 600 according to Example 3 of the present invention.

FIG. 6 is a cross-sectional diagram showing a structure of a solid-state image sensor device 600 according to Example 3 of the present invention.

Figure 14:
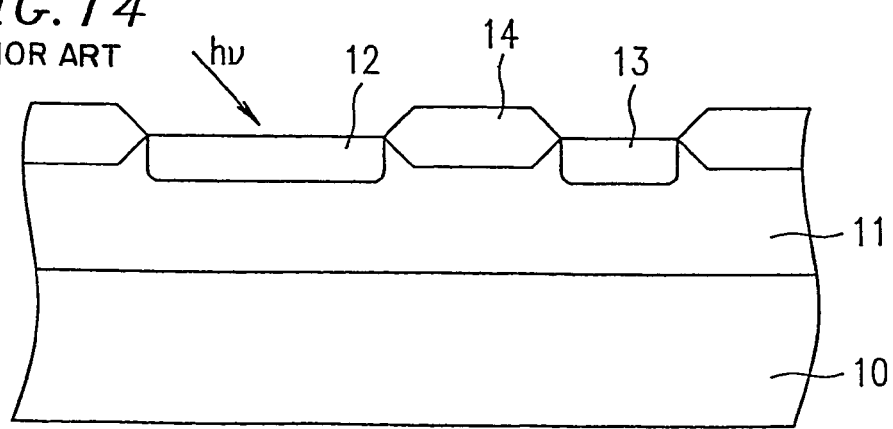
FIG. 14 is a cross-sectional view showing a structure of a typical solid-state image sensor device.

A difference to the conventional solid-state image sensor device of FIG. 14 is that a N-type region (diffusion region) 12 (photodiode) is not provided in a well 11 having a relatively high concentration, but in a p-type low-concentration substrate 10. Note that a source or drain region 13 of a MOS transistor is provided in the well 11 having a relatively high concentration, similar to FIG. 14.

Figure 7A:
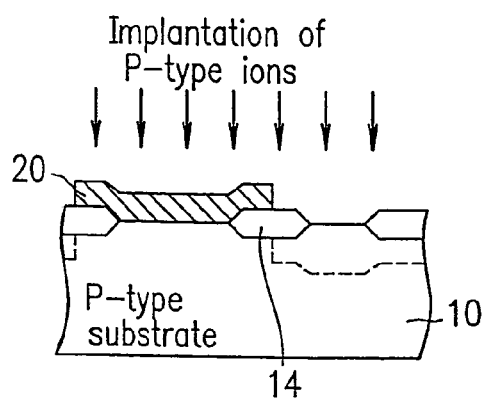
FIGS. 7A through 7C are cross-sectional views showing steps of producing the solid-state image sensor device 600 of Example 3.
Figure 7D:
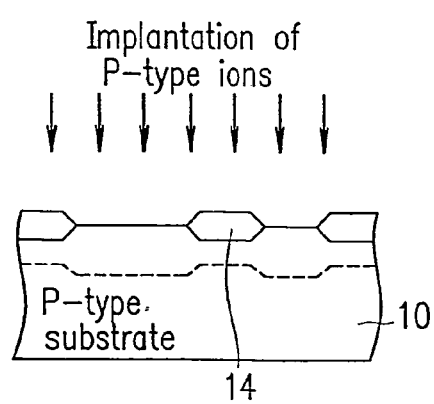
FIGS. 7D through 7F are cross-sectional views showing steps of producing a conventional solid-state image sensor device.
Figure 7B:
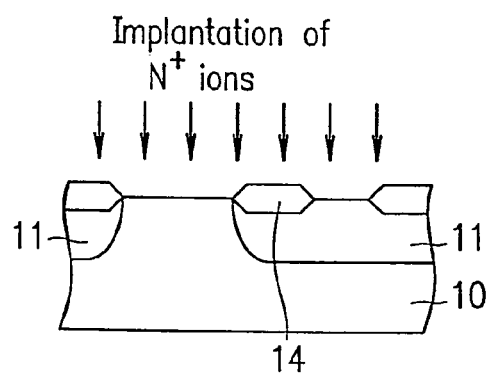
Figure 7E:
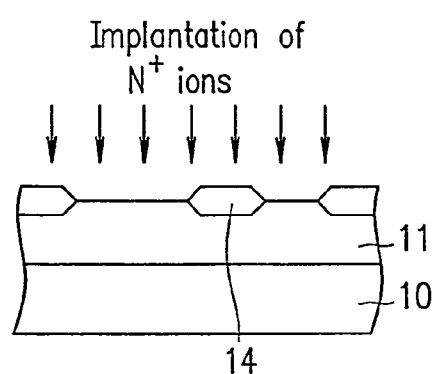
Figure 7C:
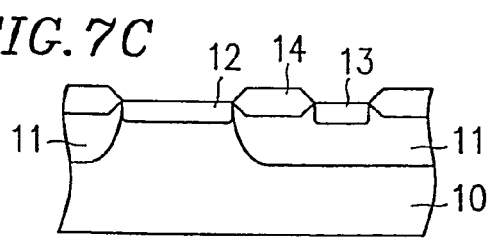
Figure 7F:
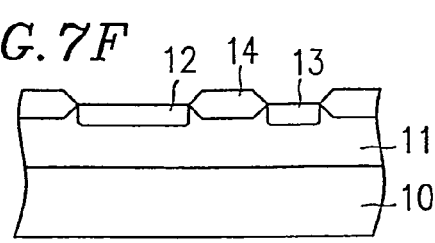

FIGS. 7A through 7C show steps of producing the solid-state image sensor device 600. FIGS. 7D through 7F show steps of producing a conventional solid-state image sensor device. Hereinafter, a production method of the solid-state image sensor device 600 of FIG. 6 will be described in comparison with the solid-state image sensor device of FIG. 14.

Referring to FIGS. 7A and 7D, P-type ions are implanted into the P-type substrate 10 so as to form the high-concentration well 11 (FIGS. 7B and 7E). In this case, in Example 3, the ion implantation is performed while a portion of the P-type substrate 10 which will be a photodiode is covered with a resist 20. Thus, the ions are implanted into a region indicated by a dashed line. Thereafter, referring to FIGS. 7B and 7E, implantation of $N^+$ ions is performed so that the source or drain region 13 (FIGS. 7C and 7F) of the MOS transistor is formed. Thus, structures shown in FIGS. 7C and 7F are obtained. Note that although the ion implantation for the formation of the well 11 is performed after the formation of the field oxide film 14, the formation of the field oxide film 14 may precede the ion implantation for the formation of the well 11.

In the structure of Example 3, the concentration gradient can be reduced in most regions of the junction interface of the photodiode. As a result, the field strength of the photodiode is further reduced so that the dark current can be further decreased. Note that in the solid-state image sensor device 600, the concentration gradient can be reduced in the entire junction interface of the photodiode. However, if the P-type ions used for the well formation are diffused in a horizontal direction (a direction from side to side in FIGS. 7A through 7F) in a subsequent thermal process, a peripheral region of the photodiode is covered with a P-type well so that a portion which is not covered with the well becomes small. In this case, a region of the junction interface of the photodiode which has a low concentration gradient becomes small.

EXAMPLE 4

Figure 8:
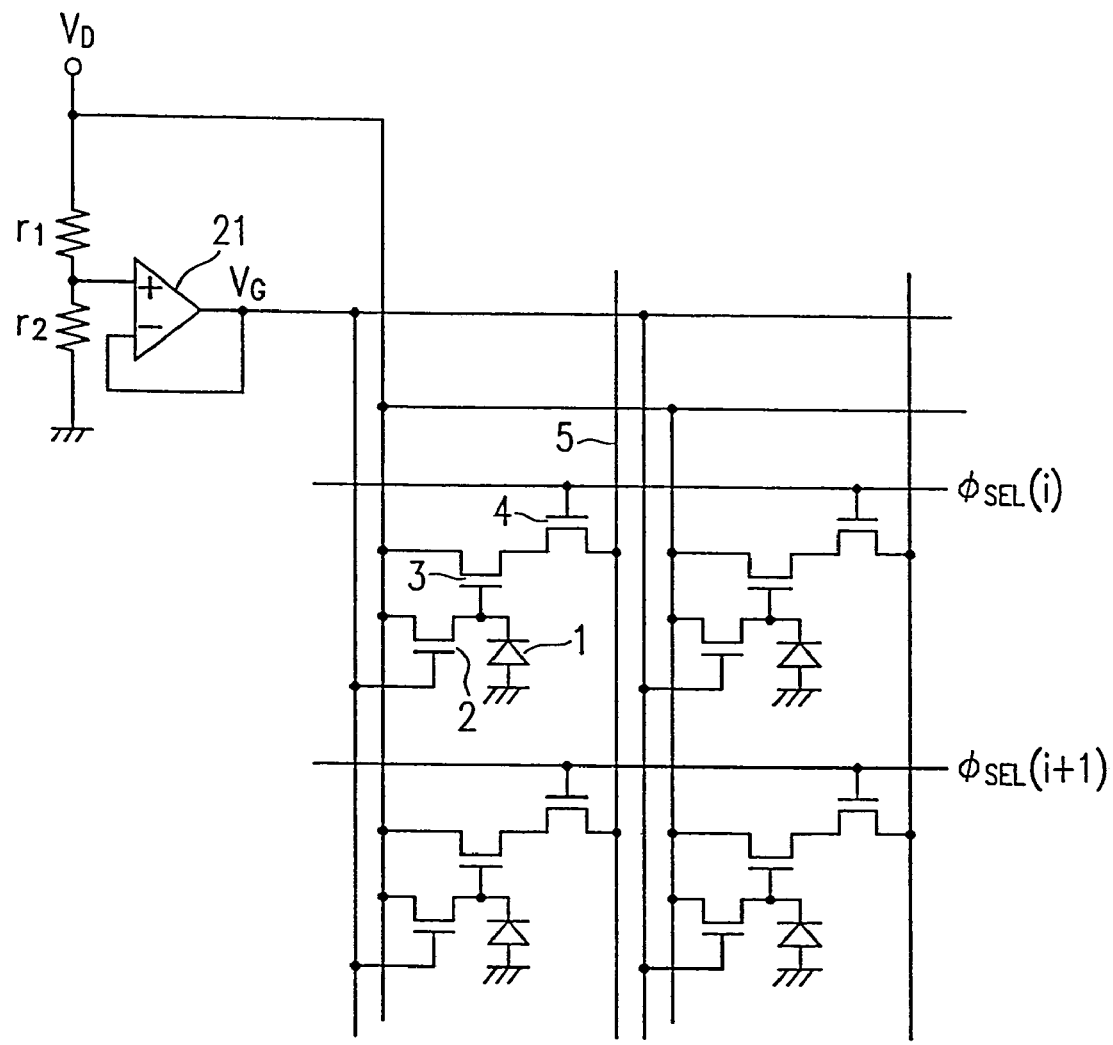
FIG. 8 is a diagram showing a structure of a solid-state image sensor apparatus 800 according to Example 4 of the present invention.
Figure 9:
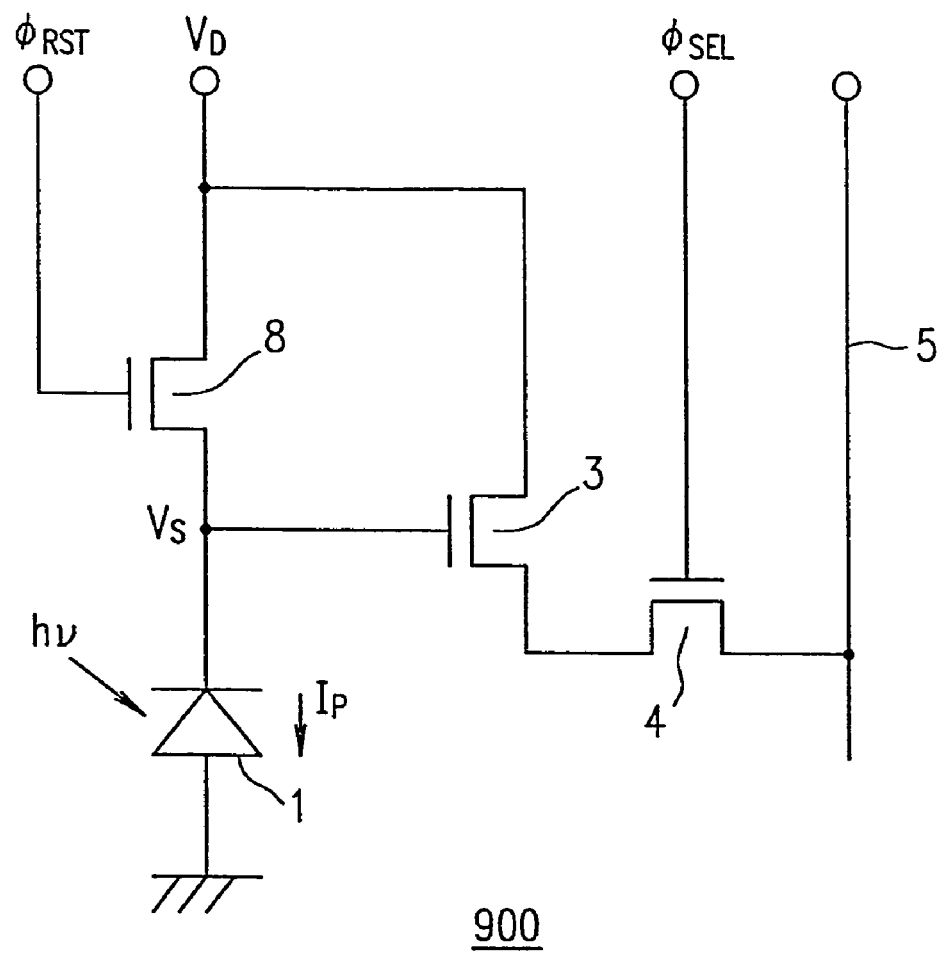
FIG. 9 is a circuit block diagram showing a structure of a conventional solid-state image sensor device 900.
Figure 10:
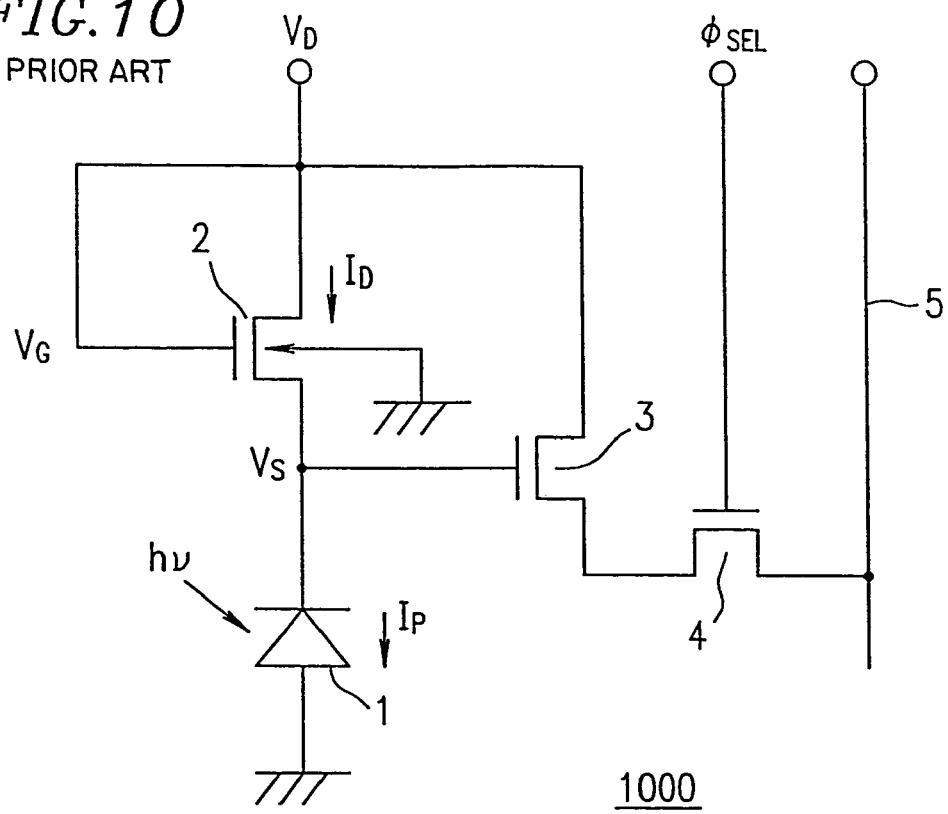
FIG. 10 is a circuit block diagram showing a structure of another conventional solid-state image sensor device 1000.

FIG. 8 is a diagram showing a structure of a solid-state image sensor apparatus 800 having a plurality of the solid-state image sensor devices of the present invention. The solid-state image sensor apparatus 800 has a $V_G$ generation circuit common to the solid-state image sensor devices which are arranged in a matrix. An amplifier 21 is a voltage follower amplifier for impedance-converting (gain 1) a voltage $V_G$ obtained by dividing $V_D$ by $r_1$ and $r_2$. The solid-state image sensor device 800 includes an enhancement transistor 3 as a second MOS transistor, as shown in Example 1. A depression transistor 6 may be provided as shown in Example 2.

In the solid-state image sensor device 800, the third MOS transistors 4 (switching element) are simultaneously transitioned to the ON state, by clock $\phi_{SEL}$, in units of a horizontal device array, thereby being connected to signal lines 5. This switching operation proceeds progressively in a vertical direction.

The solid-state image sensor device 800 includes the solid-state image sensor device 100, 400, or 600 of the present invention. Similar to Examples 1 through 3, a solid-state image sensor device having high sensitivity and a large dynamic range can be achieved.

As described above, according to the present invention, the bias voltage of a photodiode is slightly higher than a certain low value (e.g., a ground potential GND which is a reference potential), so that dark current is reduced to a great extent, and the lower limit of a photoelectric current that can be logarithmically converted is further lowered. Therefore, the sensitivity can be improved, and the dynamic range can be expanded at a lower illumination intensity side.

In this case, the voltage level of an output which is logarithmically converted is decreased, so that a second MOS transistor is likely to fall outside the operation range. Therefore, it is preferable that the second MOS transistor is of a depression type. In this case, since the input range of the second MOS transistor can be shifted toward a low voltage side, the operation range can be maintained.

Further, at least a portion of a diffusion region constituting a photodiode is provided in a low-impurity-concentration region, so that the concentration gradient of a junction interface can be reduced. Therefore, the field strength of the photodiode is more effectively lowered, thereby making it possible to further reduce dark current.

According to the present invention, a solid-state image sensor apparatus having an extremely high-sensitivity and a large dynamic range can be achieved. Therefore, an effect of the present invention is significant in practical use.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image sensor device, comprising:
   a photoelectric converter for converting incident light to electric charge;
   a logarithmic converter for logarithmically converting a photoelectric current output from the photoelectric converter, the logarithmic converter consisting of a first MOS transistor including a source connected to the photoelectric converter and a drain connected to a power source; and
   a read-out section for reading out a signal obtained by the first MOS transistor converting the photoelectric current output from the photoelectric converter, the read-out section including a second MOS transistor including a gate connected to the photoelectric converter and a source of the first MOS transistor and a drain connected to a drain of the first MOS transistor,
   wherein a gate potential of the first MOS transistor is fixed between a power source potential and a ground potential.

2. A solid-state image sensor device according to claim 1, wherein the gate potential of the first MOS transistor is higher than a threshold potential when the source of the first MOS transistor is grounded, and is sufficiently lower than the power source potential.

3. A solid-state image sensor device according to claim 1, wherein the second MOS transistor is of a depression type.

4. A solid-state image sensor device according to claim 1, wherein at least a portion of a diffusion region included in the photoelectric converter is provided in a low impurity-concentration region.

5. A solid-state image sensor apparatus comprising at least one solid-state image sensor device, wherein
   the solid-state image sensor device includes:
      a photoelectric converter for converting incident light to electric charge;
      a logarithmic converter for logarithmically converting a photoelectric current output from the photoelectric converter, the logarithmic converter consisting of a first MOS transistor including a source connected to the photoelectric converter and a drain connected to a power source; and
      a read-out section for reading out a signal obtained by the first MOS transistor converting the photoelectric current output from the photoelectric converter, the read-out section including a second MOS transistor including a gate connected to the photoelectric converter and a source of the first MOS transistor and a drain connected to a drain of the first MOS transistor,
      a gate potential of the first MOS transistor is fixed between a power source potential and a ground potential,
      the read-out section has a switching element for selecting whether to connect to a signal line, and
      a source of the second MOS transistor is connected via the switching element to the signal line.

6. A solid-state image sensor device according to claim 1, wherein the gate potential of the first MOS transistor is less than the power source potential and greater than the ground potential.

7. A solid-state image sensor device according to claim 5, wherein the gate potential of the first MOS transistor is less than the power source potential and greater than the ground potential.

* * * * *